United States Patent
Liu et al.

(10) Patent No.: US 9,257,349 B2
(45) Date of Patent: Feb. 9, 2016

(54) METHOD OF SCAVENGING IMPURITIES IN FORMING A GATE STACK HAVING AN INTERFACIAL LAYER

(71) Applicant: Taiwan Semiconductor Manufacturing Company, Ltd., Hsin-Chu (TW)

(72) Inventors: Kuan-Ting Liu, Hsinchu (TW); Liang-Gi Yao, Shin Chu (TW); Yasutoshi Okuno, Hsinchu (TW); Clement Hsingjen Wann, Carmel, NY (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/317,980

(22) Filed: Jun. 27, 2014

(65) Prior Publication Data

US 2014/0315360 A1    Oct. 23, 2014

Related U.S. Application Data

(63) Continuation of application No. 13/239,804, filed on Sep. 22, 2011, now Pat. No. 8,766,379.

(51) Int. Cl.

| | |
|---|---|
| *H01L 21/8238* | (2006.01) |
| *H01L 21/28* | (2006.01) |
| *H01L 29/49* | (2006.01) |
| *H01L 27/092* | (2006.01) |
| *H01L 29/51* | (2006.01) |

(52) U.S. Cl.
CPC .. *H01L 21/823842* (2013.01); *H01L 21/28008* (2013.01); *H01L 21/28079* (2013.01); *H01L 21/28088* (2013.01); *H01L 27/092* (2013.01); *H01L 29/4958* (2013.01); *H01L 29/4966* (2013.01); *H01L 29/513* (2013.01); *H01L 29/517* (2013.01); *H01L 29/518* (2013.01)

(58) Field of Classification Search
CPC ............... H01L 21/823842; H01L 21/28008; H01L 27/092
See application file for complete search history.

(56) References Cited

U.S. PATENT DOCUMENTS

| | | | |
|---|---|---|---|
| 7,915,111 B2 | 3/2011 | Yang et al. | |
| 7,989,902 B2 | 8/2011 | Ando et al. | |
| 7,999,323 B2 | 8/2011 | Cartier et al. | |
| 8,076,732 B2 | 12/2011 | Ichihara et al. | |
| 8,304,836 B2 | 11/2012 | Jagannathan et al. | |

(Continued)

*Primary Examiner* — Whitney T Moore
*Assistant Examiner* — Joseph Galvin, III
(74) *Attorney, Agent, or Firm* — Haynes and Boone, LLP

(57) ABSTRACT

A multi-layer scavenging metal gate stack, and methods of manufacturing the same, are disclosed. In an example, a gate stack disposed over a semiconductor substrate includes an interfacial dielectric layer disposed over the semiconductor substrate, a high-k dielectric layer disposed over the interfacial dielectric layer, a first conductive layer disposed over the high-k dielectric layer, and a second conductive layer disposed over the first conductive layer. The first conductive layer includes a first metal layer disposed over the high-k dielectric layer, a second metal layer disposed over the first metal layer, and a third metal layer disposed over the second metal layer. The first metal layer includes a material that scavenges oxygen impurities from the interfacial dielectric layer, and the second metal layer includes a material that adsorbs oxygen impurities from the third metal layer and prevents oxygen impurities from diffusing into the first metal layer.

20 Claims, 2 Drawing Sheets

(56) References Cited

U.S. PATENT DOCUMENTS

| | | | |
|---|---|---|---|
| 2007/0178634 A1 | 8/2007 | Jung et al. | |
| 2009/0321844 A1* | 12/2009 | Ichihara | H01L 21/823842 257/369 |
| 2010/0176456 A1* | 7/2010 | Ikeno | H01L 21/823857 257/369 |
| 2011/0115027 A1* | 5/2011 | Jagannathan | H01L 21/28088 257/369 |
| 2012/0280288 A1* | 11/2012 | Ando | H01L 21/28176 257/288 |
| 2013/0032886 A1 | 2/2013 | Ando et al. | |

* cited by examiner

US 9,257,349 B2

METHOD OF SCAVENGING IMPURITIES IN FORMING A GATE STACK HAVING AN INTERFACIAL LAYER

PRIORITY DATA

This application is a Continuation of U.S. Ser. No. 13/239,804 filed Sep. 22, 2011, the entire disclosure of which is incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. These advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down also presents critical challenges for manufacturing and processing IC devices having gate stacks. For example, as metal-oxide-semiconductor field-effect transistors (MOSFETs) are scaled down through various technology nodes, high-k/metal gate stacks have been implemented. Capacitance equivalent thickness (CET) scaling of the high-k dielectric material can improve high-k/metal gate device performance. However, it has been observed that CET values for the high-k material are increased by growth of an interfacial layer of the high-k/metal gate stack during processing, such as during thermal processes. Accordingly, although existing high-k/metal gate stacks and methods of manufacturing such high-k/metal gate stacks have been generally adequate for their intended purposes, as device scaling down continues, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for only illustration purposes. In fact, the dimensions of the various features may be arbitrarily increased or reduced for clarity of discussion.

DETAILED DESCRIPTION

Figure 1:
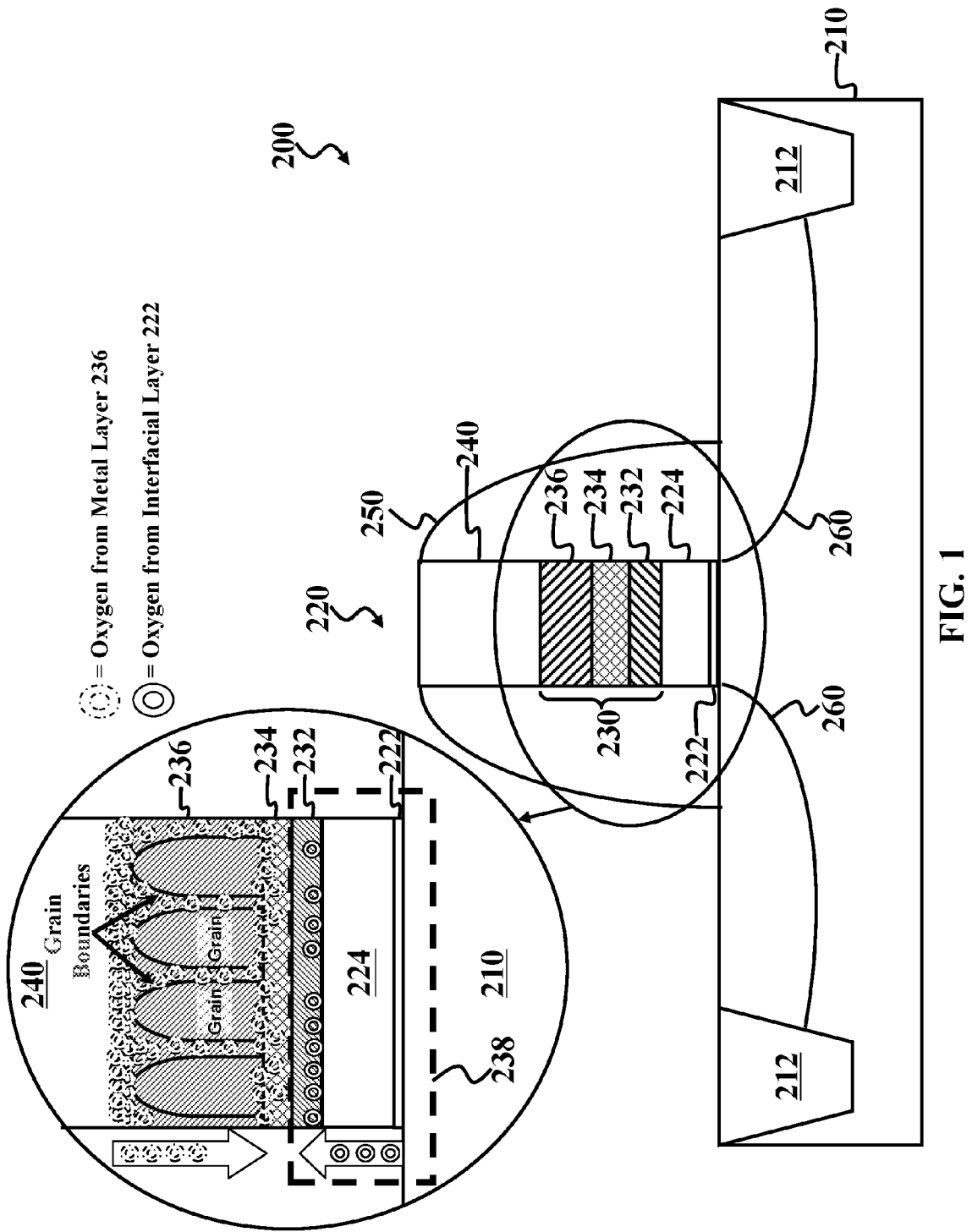
FIG. 1 is a diagrammatic cross-sectional view of an integrated circuit device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a diagrammatic cross-sectional view of an integrated circuit device 200 according to various aspects of the present disclosure. FIG. 1 has been simplified for the sake of clarity to better understand the inventive concepts of the present disclosure. In the depicted embodiment, the integrated circuit device 200 includes a field-effect transistor device, such as an n-channel field effect transistor (NFET) or a p-channel field effect transistor (PFET). The integrated circuit device 200 can further include memory cells and/or logic circuits; passive components such as resistors, capacitors, inductors, and/or fuses; active components, such as metal-oxide-semiconductor field effect transistors (MOSFETs), complementary metal-oxide-semiconductor transistors (CMOSs), high voltage transistors, and/or high frequency transistors; other suitable components; or combinations thereof. Additional features can be added in the integrated circuit device 200, and some of the features described below can be replaced or eliminated for additional embodiments of the integrated circuit device 200.

The integrated circuit device 200 includes a substrate 210. In the depicted embodiment, the substrate 210 is a semiconductor substrate including silicon. Alternatively or additionally, the substrate 210 includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 210 is a semiconductor on insulator (SOI). In other alternatives, semiconductor substrate 210 may include a doped epi layer, a gradient semiconductor layer, and/or a semiconductor layer overlying another semiconductor layer of a different type, such as a silicon layer on a silicon germanium layer. The substrate 210 includes various doping configurations depending on design requirements of the integrated circuit device 200. For example, the substrate 210 may include various doped regions doped with p-type dopants, such as boron or $BF_2$; n-type dopants, such as phosphorus or arsenic; or combinations thereof. The doped regions may be formed on the semiconductor substrate, in a P-well structure, in a N-well structure, in a dual-well structure, or using a raised structure.

Isolation features 212 are disposed in the substrate 210 to isolate various regions and/or devices of the substrate 210. The isolation features 212 utilize isolation technology, such as local oxidation of silicon (LOCOS) and/or shallow trench isolation (STI), to define and electrically isolate the various regions. The isolation features 212 include silicon oxide, silicon nitride, silicon oxynitride, other suitable materials, or combinations thereof. The isolation features 212 are formed by any suitable process. As one example, forming an STI includes using a lithography process to expose a portion of the substrate, etching a trench in the exposed portion of the substrate (for example, by using a dry etching and/or wet etching), and filling the trench (for example, by using a chemical vapor deposition process) with one or more dielectric materials. For example, the filled trench may have a multi-layer structure, such as a thermal oxide liner layer filled with silicon nitride or silicon oxide.

A gate structure 220 is disposed over the substrate 210. In the depicted embodiment, the gate structure 220 includes a gate stack having an interfacial layer 222, a high-k dielectric layer 224, a conductive layer 230 (that includes metal layer 232, metal layer 234, and metal layer 236), and a conductive layer 240. The interfacial layer 222 and the high-k dielectric layer 224 may be collectively referred to as a gate dielectric layer of the gate structure 220, and the conductive layers 230 and 240 may be collectively referred to as a gate electrode of the gate structure 220. The gate stack may include additional layers, such as a hard mask layer, a capping layer, a diffusion/barrier layer, a dielectric layer, a metal layer, other suitable layers, or combinations thereof. The gate stack of the gate structure 220 is formed in a gate first process, a gate last process, or a combination gate first/gate last process. The gate first process, gate last process, and combination gate first/gate last process include deposition processes, lithography patterning processes, etching processes, or combinations thereof. The deposition processes include physical vapor deposition (PVD), chemical vapor deposition (CVD), atomic layer deposition (ALD), plasma enhanced CVD (PECVD), remote plasma CVD (RPCVD), molecular organic CVD (MOCVD), sputtering, plating, other suitable methods, or combinations thereof. The lithography patterning processes include photoresist coating (e.g., spin-on coating), soft baking, mask aligning, exposure, post-exposure baking, developing the photoresist, rinsing, drying (e.g., hard baking), other suitable processes, or combinations thereof. The lithography exposure process may be implemented or replaced by other proper methods such as maskless lithography, electron-beam writing, ion-beam writing, and molecular imprint. The etching processes include dry etching, wet etching, or combinations thereof.

The interfacial dielectric layer 222 is disposed over the substrate 210. In the depicted embodiment, the interfacial dielectric layer 222 is an ultra-thin interfacial dielectric layer, meaning that the interfacial dielectric layer 222 has a thickness less than or equal to about 6 Å. The interfacial dielectric layer 222 is an oxide-containing layer, such as a silicon oxide ($SiO_2$) layer or a silicon oxynitride (SiON) layer. The interfacial dielectric layer 222 is formed by a chemical oxide technique, thermal oxide technique, atomic layer deposition (ALD), chemical vapor deposition (CVD), or other suitable technique. A cleaning process, such as an HF-last pre-gate cleaning process (for example, using a hydrofluoric (HF) acid solution), may be performed before the interfacial dielectric layer 222 is formed over the substrate 210.

The high-k dielectric layer 224 is disposed over the interfacial dielectric layer 222. The high-k dielectric layer 224 has a thickness of about 5 Å to about 50 Å. In the depicted embodiment, the high-k dielectric layer 224 includes hafnium oxide ($HfO_2$). Alternatively or additionally, the high-k dielectric layer 224 includes Hf—X—O material, where X is silicon or metal, such as hafnium silicon oxide (HfSiO), hafnium silicon oxynitride (HfSiON), hafnium tantalum oxide (HMO), hafnium titanium oxide (HfTiO), or hafnium zirconium oxide (HfZrO); hafnium dioxide-alumina ($HfO_2$—$Al_2O_3$) alloy; zirconium oxide ($ZrO_2$); Zr—X—O material, where X is silicon or metal, such as zirconium silicate ($ZrSiO_4$) or zirconium aluminate (ZrAlO); titanium oxide ($TiO_2$); Ti—X—O, where X is silicon or metal; lanthanum oxide ($La_2O_3$); La—X—O material, where X is silicon or metal; rare-earth oxide; other suitable high-k dielectric material; or combinations thereof. The high-k dielectric layer 224 is formed by a suitable process, such as atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, other suitable processes, or combinations thereof.

The conductive layer 230 is disposed over the high-k dielectric layer 224. The conductive layer 230 may be referred to as a capping layer of the gate stack of the gate structure 220. In an example, the conductive layer 230 has a thickness of about 9 Å to about 85 Å. In the depicted embodiment, as noted above, the conductive layer 230 includes the metal layer 232, the metal layer 234, and the metal layer 236. In an example, a combined thickness of the metal layer 232 and the metal layer 234 is about 4 Å to about 35 Å. The metal layer 232, metal layer 234, and metal layer 236 of the conductive layer 230 are configured to minimize or prevent growth of the interfacial dielectric layer 222 during subsequent processing, such as during an annealing process. The annealing process may be used to release stress and/or repair defects in the gate stack of the gate structure 220, or used to activate dopants of a source/drain region of the integrated circuit device 200. The annealing process may be used for other purposes during subsequent processing. In an example, the conductive layer 230 minimizes or prevents growth of the interfacial dielectric layer 222 during an annealing process having a temperature greater than or equal to about 1050° C.

An exploded view of a portion of the gate stack in FIG. 1 illustrates how the conductive layer 230 minimizes or prevents growth of the interfacial dielectric layer 222 during subsequent processing by preventing impurity atoms (such as oxygen impurity atoms) from migrating to the interfacial dielectric layer 222. For example, the metal layer 236 includes various grains having grain boundaries, and during processing, such as during an annealing process, oxygen impurities can seep into the metal layer 236 between the grains of the metal layer 236 and migrate towards the interfacial dielectric layer 222. Such oxygen impurities may be adsorbed from the ambient atmosphere in which the integrated circuit device 200 is being processed. The metal layer 234 includes a material that adsorbs such oxygen impurities from the metal layer 236 and that prevents or retards such oxygen impurities from diffusing into the metal layer 232. Because the metal layer 234 can adsorb oxygen impurities from the metal layer 236 while preventing such oxygen impurities from diffusing into the metal layer 232, a closed system 238 exists between the metal layer 232, high-k dielectric layer 224, and interfacial layer 222. The closed system 238 will not incorporate oxygen impurities from the metal layer 236, which would cause growth of the interfacial dielectric layer 222 if such impurities were introduced to the interfacial dielectric layer 222. Further, in the depicted embodiment, the metal layer 232 includes a material that scavenges oxygen impurities from the interfacial dielectric layer 222. The conductive layer 230 thus prevents or minimizes growth of the interfacial dielectric layer 222 by preventing oxygen impurities from reaching the interfacial dielectric layer 222 and scavenging oxygen impurities from the interfacial dielectric layer 222 during subsequent processing, such that the interfacial dielectric layer 222 remains ultra-thin, for example, with a thickness of less than or equal to about 6 Å. By preventing or minimizing growth of the interfacial layer 222 during subsequent processing, the capacitive equivalent thickness (CET) of the high-k dielectric layer 224 can be improved, which in turn can improve overall performance of the integrated circuit device 200. Different embodiments may have different advantages, and no particular advantage is necessarily required of any embodiment.

The metal layer 232 is disposed over the high-k dielectric layer 224. In an example, the metal layer 232 has a thickness of about 2 Å to about 15 Å. As noted above, the metal layer 232 includes a material configured to scavenge impurity atoms, such as oxygen impurities, from the interfacial dielectric layer 222. In the depicted embodiment, the metal layer 232 includes a titanium-rich or tantalum-rich material to facilitate scavenging of impurity atoms, such as oxygen impurities, from the interfacial dielectric layer 222. For example, the metal layer 232 includes a transition metal nitride, such as titanium nitride (TiN) or a transition metal carbide, such as tantalum carbide (TaC). The metal layer 232 is metal rich (in other words, titanium-rich or tantalum-rich) if the metal to nitrogen or carbon ratio is greater than one (in other words, M/N>1 or M/C>1). In an example, where the metal layer 232 is a titanium-rich TiN layer, the metal layer 232 has a Ti:N ratio of about 1.05:1 to about 2:1. In another example, where the metal layer 232 is a tantalum-rich TaC layer, the metal layer 232 has a Ta:C ratio of about 1.05:1 to about 2:1. Alternatively, the metal layer 232 includes a reactive metal material to facilitate scavenging of impurity atoms from the interfacial dielectric layer 222, such as hafnium (Hf), titanium (Ti), cobalt (Co), aluminum (Al), zirconium (Zr), lanthanum (La), magnesium (Mg), other reactive metal, or combinations thereof. In an example, the reactive metal material is a material capable of reacting with oxygen.

The metal layer 234 is disposed over the metal layer 232. In an example, the metal layer 234 has a thickness of about 2 Å to about 20 Å. As noted above, the metal layer 234 includes a material that adsorbs impurity atoms, such as oxygen impurities, from the metal layer 236 and prevents or retards such impurities from diffusing into the metal layer 232. In the depicted embodiment, since the metal layer 232 includes a titanium-rich or tantalum-rich material, the metal layer 234 includes a reactive metal material to facilitate adsorbing impurity atoms from the metal layer 236 while preventing such impurity atoms from diffusing into the metal layer 232. For example, the metal layer 234 includes hafnium (Hf). In other examples, the metal layer 234 may include titanium (Ti), cobalt (Co), aluminum (Al), zirconium (Zr), lanthanum (La), magnesium (Mg), other reactive metal, or combinations thereof. Alternatively, where the metal layer 232 includes the reactive metal material, the metal layer 234 includes a titanium-rich or tantalum-rich material that facilitates adsorbing impurity atoms from the metal layer 236 while preventing such impurity atoms from diffusing into the metal layer 232. For example, the metal layer 234 includes a transition metal nitride or a transition metal carbide, such as titanium nitride (TiN) or tantalum carbide (TaC). The metal layer 234 is metal rich (in other words, titanium-rich or tantalum-rich) if the metal to nitrogen or carbon ratio is greater than one (in other words, M/N>1 or M/C>1). In an example, where the metal layer 234 is a titanium-rich TiN layer, the metal layer 234 has a Ti:N ratio of about 1.05:1 to about 2:1. In another example, where the metal layer 234 is a tantalum-rich TaC layer, the metal layer 234 has a Ta:C ratio of about 1.05:1 to about 2:1. From the foregoing, it is noted that one of the metal layer 232 and metal layer 234 includes the titanium-rich or tantalum-rich material, while the other one of the metal layer 232 and the metal layer 234 includes the reactive metal material. This ensures that the metal layer 234 effectively prevents impurity atoms from diffusing into the metal layer 232.

The metal layer 236 is disposed over the metal layer 234. In an example, the metal layer 236 has a thickness of about 5 Å to about 50 Å. In the depicted embodiment, the metal layer 236 includes a nitrogen-rich or carbon-rich material. The metal layer 236 is nitrogen-rich or carbon rich if a metal to nitrogen or carbon ratio is less than one (in other words, M/N<1 or M/C<1). For example, the metal layer 236 includes a transition metal nitride or a transition metal carbide, such as titanium nitride (TiN) or tantalum carbide (TaC). In an example, where the metal layer 236 is a nitrogen-rich TiN layer, the metal layer 236 has a Ti:N ratio of about 0.9:1 to about 1:1. In another example, where the metal layer 236 is a carbon-rich TaC layer, the metal layer 236 has a Ta:C ratio of about 0.9:1 to about 1:1. Alternatively, the metal layer 236 includes another nitrogen-rich transition metal nitride, such as hafnium nitride (HfN), or carbon-rich transition metal carbide, such as titanium carbide (TiC) or vanadium carbide (VnC).

The gate structure 220 further includes spacers 250 formed by a suitable process. For example, a dielectric layer, such as a silicon nitride layer, is blanket deposited over the integrated circuit device 200; and then, the silicon nitride layer is anisotropically etched to remove the silicon nitride layer to form spacers 250 as illustrated in FIG. 1. The spacers 250 are positioned adjacent sidewalls of the gate stack (interfacial layer 222, high-k dielectric layer 224, conductive layer 230, and conductive layer 240) of the gate structure 220. Alternatively or additionally, the spacers 250 include another dielectric material, such as silicon oxide, silicon carbon nitride, or combinations thereof.

Figure 2:
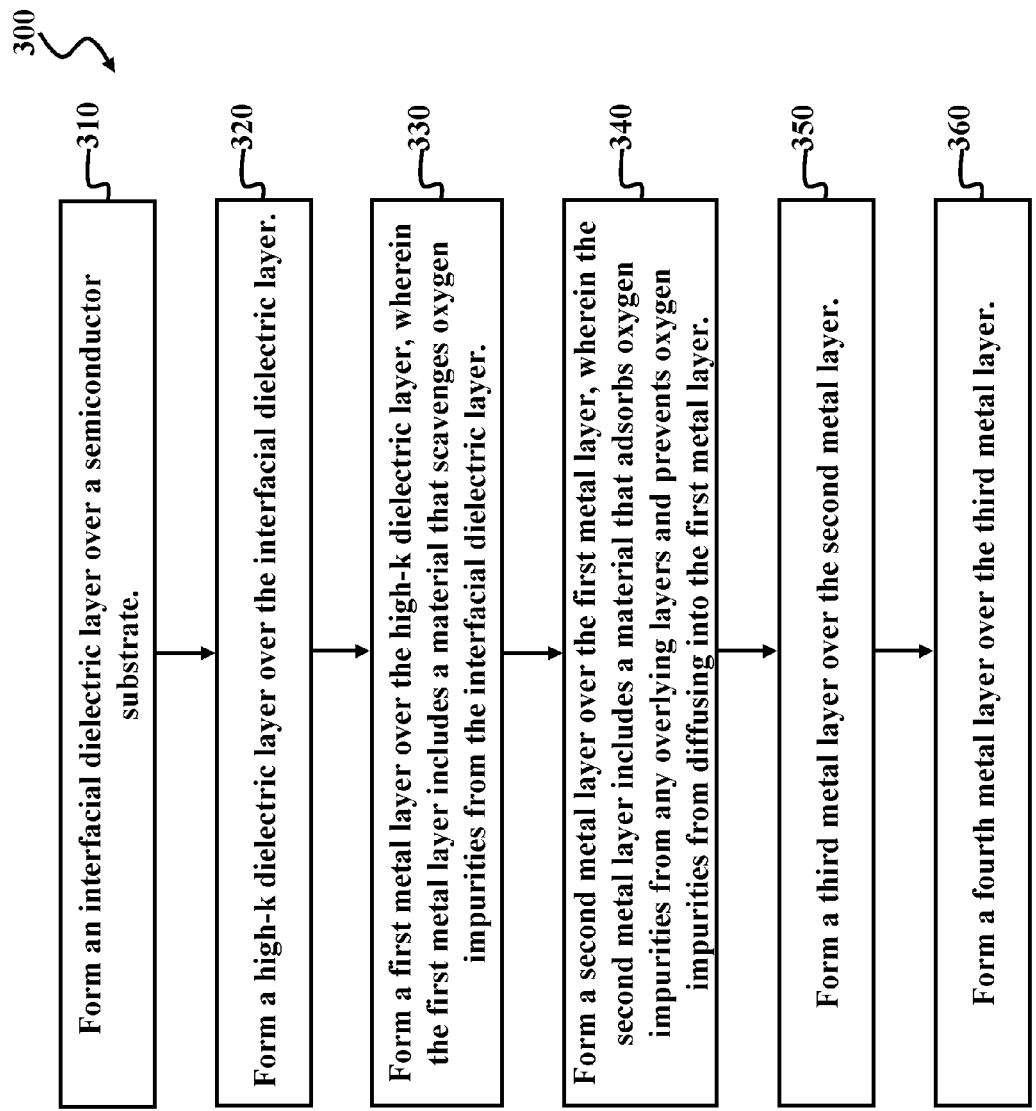
FIG. 2 is a flow chart of a method for fabricating an integrated circuit device, such as the integrated circuit device of FIG. 1, according to various aspects of the present disclosure.

The gate structure 220 further includes spacers 250 formed by a suitable process. For example, a dielectric layer, such as a silicon nitride layer, is blanket deposited over the integrated circuit device 200; and then, the silicon nitride layer is anisotropically etched to remove the silicon nitride layer to form spacers 250 as illustrated in FIG. 2. The spacers 250 are positioned adjacent sidewalls of the gate stack (interfacial layer 222, high-k dielectric layer 224, conductive layer 230, and conductive layer 240) of the gate structure 220. Alternatively or additionally, the spacers 250 include another dielectric material, such as silicon oxide, silicon carbon nitride, or combinations thereof.

The integrated circuit device 200 may include other features. For example, in the depicted embodiment, the integrated circuit device 200 includes source/drain features 260 disposed in the substrate 210. The source/drain features 260 are interposed by the gate structure 220. The source/drain features 260 may include lightly doped source and drain (LDD) regions and/or heavily doped source and drain (HDD) regions. The LDD and/or HDD regions may be formed by ion implantation or diffusion of n-type dopants, such as phosphorous or arsenic, or p-type dopants, such as boron. The LDD and/or HDD regions may be formed at any time in the depicted embodiment. The source/drain features 260 may include raised source/drain features. Silicide features may be formed over the source/drain features 260, for example, to reduce contact resistance. The silicide features may be formed over the source and drain features by a self-aligned salicide process, which can include depositing a metal layer, annealing the metal layer such that the metal layer is able to react with silicon to form silicide, and then removing the non-reacted metal layer.

In an example, an inter-level dielectric (ILD) layer is formed on the substrate and a chemical mechanical polishing (CMP) process is further applied to the substrate to planarize the substrate. A contact etch stop layer (CESL) may be formed on top of the gate structure 220 before forming the ILD layer. In an example, the conductive layer 240 remains polysilicon in the gate structure 220 of the integrated circuit device 200. In another example, the polysilicon is removed and replaced with a metal in a gate last or gate replacement process. Further, in an example, a multilayer interconnection (MLI) including metal layers and inter-metal dielectric (IMD) layers is formed over the substrate 210, such as over the ILD layer, to electrically connect various features or structures of the integrated circuit device 200. The multilayer interconnection includes vertical interconnects, such as vias or contacts, and horizontal interconnects, such as metal lines. The various interconnection features may implement various conductive materials including aluminum, copper, titanium, tungsten, alloys thereof, silicide materials, other suitable materials, or combinations thereof. In an example, a damascene process or dual damascene process is used to form a copper or aluminum multilayer interconnection structure.

FIG. 2 is a flow chart of a method 300 for fabricating an integrated circuit device, in portion or entirety, according to various aspects of the present disclosure. For example, the method 300 fabricates a gate stack of an integrated circuit device, such as the integrated circuit device 200 of FIG. 1 described above. The gate stack can be formed in a gate-first process, a gate-last process, or a combination of a gate-first and gate-last process. The method 300 begins at block 310 an interfacial dielectric layer is formed over a semiconductor substrate. The interfacial layer may be similar to the interfacial dielectric layer 222 described above. At block 320, a high-k dielectric layer is formed over the interfacial dielectric layer. The high-k dielectric layer may be similar to the high-k dielectric layer 224 described above. At block 330, a first metal layer is formed over the high-k dielectric layer. The first metal layer includes a material that scavenges oxygen impurities from the interfacial dielectric layer. The first metal layer may be similar to the metal layer 232 described above. At block 340, a second metal layer is formed over the first metal layer. The second metal layer includes a material that adsorbs oxygen impurities from any overlying layers and prevents oxygen impurities from diffusing into the first metal layer. The second metal layer may be similar to the metal layer 234 described above. At block 350 and block 360, respectively, a third metal layer is formed over the second metal layer, and a fourth metal layer is formed over the third metal layer. The third metal layer may be similar to the metal layer 236 described above, and the fourth metal layer may be similar to the conductive layer 240 described above. In an example, the second metal layer adsorbs oxygen impurities from the third metal layer. In another example, the second metal layer adsorbs oxygen impurities from the third metal layer and the fourth metal layer. The method 300 may continue to fabricate other features of the integrated circuit device. For example, spacers, such as spacers 250 described above, may be formed along sidewalls of the gate stack and/or source/drain features, such as source/drain features 260 described above, may be formed in the semiconductor substrate, such that the gate stack interposes the source/drain features. Additional steps can be provided before, during, and after the method 300, and some of the steps described can be replaced or eliminated for additional embodiments of the method 300.

The present disclosure provides for many different embodiments. In an example, an integrated circuit device includes a gate stack disposed over a semiconductor substrate includes an interfacial dielectric layer disposed over the semiconductor substrate, a high-k dielectric layer disposed over the interfacial dielectric layer, a first conductive layer disposed over the high-k dielectric layer, and a second conductive layer disposed over the first conductive layer. The first conductive layer includes a first metal layer disposed over the high-k dielectric layer, a second metal layer disposed over the first metal layer, and a third metal layer disposed over the second metal layer. The first metal layer includes a material that scavenges oxygen impurities from the interfacial dielectric layer, and the second metal layer includes a material that adsorbs oxygen impurities from the third metal layer and prevents oxygen impurities from diffusing into the first metal layer. The integrated circuit device may further include a set of spacers disposed along sidewalls of the gate stack. The integrated circuit device may further include a source feature and a drain feature disposed in the semiconductor substrate, wherein the gate stack interposes the source feature and the drain feature.

The interfacial dielectric layer is an ultra-thin interfacial dielectric layer with a thickness, for example, less than or equal to about 6 Å. The interfacial dielectric layer includes an oxide-containing material. In an example, the material of the first metal layer is one of a titanium-rich material and a tantalum-rich material; and the material of the second metal layer is a reactive metal material. In another example, the material of the first metal layer is a reactive metal material; and the material of the second metal layer is one of a titanium-rich material and a tantalum-rich material. The titanium-rich material may include titanium nitride with a Ti:N ratio of about 1.05:1 to about 2:1. The tantalum-rich material may include tantalum carbide with a Ta:C ratio of about 1.05:1 to about 2:1. The reactive metal material may be one of hafnium (Hf), titanium (Ti), cobalt (Co), aluminum (Al), zirconium (Zr), lanthanum (La), and magnesium (Mg). The third metal layer includes one of a nitrogen-rich material and a carbon-rich material. The nitrogen-rich material may include titanium nitride with a Ti:N ratio of about 0.9:1 to about 1:1. The carbon-rich material includes tantalum carbide with a Ta:C ratio of about 0.9:1 to about 1:1. The second conductive layer may include polysilicon.

In another example, a gate stack disposed over a semiconductor substrate includes an interfacial dielectric layer disposed over the semiconductor substrate, a high-k dielectric layer disposed over the interfacial layer, a first conductive layer disposed over the high-k dielectric layer, and a second conductive layer disposed over the first conductive layer. The first conductive layer includes a first metal layer disposed over the high-k dielectric layer, a second metal layer disposed over the first metal layer, and a third metal layer disposed over the second metal layer. The first metal layer includes one of: a titanium-rich material or a tantalum-rich material, and a reactive metal material. The second metal layer includes the other one of the titanium-rich material and the tantalum-rich material and the reactive metal material. In an example, the first metal layer includes the titanium-rich material, the second metal layer includes the reactive metal material, and the third metal layer includes a nitrogen-rich material. The titanium-rich material may include titanium nitride with a Ti:N ratio of about 1.05:1 to about 2:1, the reactive metal material may include hafnium (Hf), and the nitrogen-rich material may include titanium nitride with a Ti:N ratio of about 0.9:1 to about 1:1.

In yet another example, a method includes forming a gate stack over a semiconductor substrate. Forming the gate stack includes forming an interfacial dielectric layer over the semiconductor substrate; forming a high-k dielectric layer over the interfacial dielectric layer; forming a first conductive layer over the high-k dielectric layer; and forming a second conductive layer disposed over the first conductive layer. Forming the first conductive layer includes: forming a first metal layer over the high-k dielectric layer; forming a second metal layer over the first metal layer, and forming a third metal layer over the second metal layer. Forming the first metal layer includes forming a material that scavenges oxygen impurities from the interfacial dielectric layer, and forming the second metal layer includes forming a material that adsorbs oxygen impurities from the third metal layer and prevents oxygen impurities from diffusing into the first metal layer. Forming the material that scavenges oxygen impurities from the interfacial dielectric layer may include forming a titanium nitride layer with a Ti:N ratio of about 1.05:1 to about 2:1. Forming the material that adsorbs oxygen impurities from the third metal layer and prevents oxygen impurities from diffusing into the first metal layer may include forming a hafnium (Hf) layer. Forming the third metal layer may include forming a titanium nitride layer with a Ti:N ratio of about 0.9:1 to about 1:1. Forming the second conductive layer may include forming a polysilicon layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a gate structure, comprising:
forming an interfacial layer on a semiconductor substrate;
forming a high-k dielectric layer on the interfacial layer;
forming a first metal layer over the high-k dielectric layer, wherein the first metal layer includes a first material wherein forming the first metal layer includes depositing the first material selected from the group consisting of titanium-rich TiN and tantalum-rich TaN;
scavenging oxygen impurities from the interfacial layer using the first material;
forming a second metal layer over the first metal layer, wherein the second metal layer includes a second material; and
adsorbing oxygen impurities from at least one layer of a nitrogen-rich material or a carbon-rich material overlying the second metal using the second material; and
forming a work function layer over the at least one layer.

2. The method of claim 1, further comprising:
using the interfacial layer, the high-k dielectric layer, the first metal layer, the second metal layer, and the at least one layer to form each of a p-type metal oxide semiconductor (PMOS) gate stack and an n-type metal oxide semiconductor (NMOS) gate stack disposed over the semiconductor substrate.

3. The method of claim 2, wherein the forming the work function layer includes forming a p-type work function layer in the PMOS gate stack over the at least one layer.

4. The method of claim 2, wherein the forming the work function layer includes
forming an n-type work function layer in the NMOS gate stack over the at least one layer.

5. The method of claim 1, wherein forming the first metal layer includes depositing one of the titanium rich TiN and the tantalum rich TaN having a metal to nitride ratio of approximately 2:1.

6. The method of claim 1, wherein forming the second metal layer includes depositing the second material selected from the group consisting of hafnium (Hf), titanium (Ti), cobalt (Co), aluminum (Al), zirconium (Zr), lanthanum (La), magnesium (Mg), and combinations thereof.

7. The method of claim 1, wherein the forming the interfacial dielectric layer includes forming a thickness of less than or equal to about 6 Å.

8. The method of claim 1, further comprising:
using the second material to prevent oxygen impurities from diffusing into the first metal layer.

9. The method of claim 1, wherein the forming the at least one layer includes forming one of the nitrogen-rich material and the carbon-rich material having a ratio of carbon or nitrogen to metal between 0.9:1 and less than 1:1.

10. The method of claim 1, further comprising:
forming a polysilicon material over the at least one layer, wherein the polysilicon provides a gate electrode for the gate structure.

11. A method comprising:
forming a gate stack disposed over a semiconductor substrate, wherein the forming the gate stack includes:
forming an interfacial dielectric layer and an overlying high-k dielectric layer disposed over the interfacial layer;
forming a first conductive layer disposed over the high-k dielectric layer, wherein the forming the first conductive layer includes:
forming a first metal layer disposed over the high-k dielectric layer, wherein the first metal layer is a reactive metal material selected from the group consisting of Hf, Ti, Co, Al, Zr, La, Mg, and combinations thereof;
forming a second metal layer disposed over the first metal layer, wherein the second metal layer is one of Ti-rich TiN and a Ta-rich TaN; and
forming a third metal layer disposed over the first and second metal layers; and
after forming the first conductive layer, forming a second conductive layer disposed over the first conductive layer, wherein the second conductive layer is a work function layer.

12. The method of claim 11, further comprising:
performing a cleaning process on the semiconductor substrate prior to forming the interfacial layer.

13. The method of claim 11, further comprising:
adsorbing impurity atoms from the third metal layer using the second metal layer during an anneal process.

14. The method of claim 11, further comprising:
preventing impurity atoms from the third metal layer from diffusing into the first metal layer using the second metal layer during an anneal process.

15. The method of claim 11, further comprising:
using the first metal layer to scavenge oxygen impurities from the interfacial layer.

16. The method of claim 11, further comprising:
minimizing growth of the interfacial layer during a high temperature process by using the first metal layer to scavenge oxygen impurities from the interfacial layer.

17. A method of forming a gate structure, comprising:
forming dielectric layer on a semiconductor substrate;
forming a first metal layer over the dielectric layer, wherein the first metal layer includes a first material that is one of Hf, Ti, Co, Al, Zr, La, Mg, and combinations thereof;
forming a second metal layer over the first metal layer, wherein the second metal layer includes a second material that is one of Ti-rich TiN and a Ta-rich TaN; and
performing an anneal process on the semiconductor substrate after forming the second metal layer, wherein during the anneal process the first material scavenges oxygen impurities from the dielectric layer using the first material and the second metal layer adsorbs oxygen impurities from at least one layer overlying the second metal layer.

18. The method of claim 17, wherein the second material is the Ti-rich TiN and includes titanium nitride with a Ti:N ratio of about 1.05:1 to about 2:1.

19. The method of claim 17, wherein the second material is the Ta-rich TaN and includes tantalum carbide with a Ta:N ratio of about 1.05:1 to about 2:1.

20. The method of claim 17, further comprising: forming the at least one layer overlying the second metal layer by forming a nitrogen-rich material and a carbon-rich material.

* * * * *